United States Patent [19]

Chevallier et al.

[11] Patent Number: 4,610,731

[45] Date of Patent: Sep. 9, 1986

[54] SHALLOW IMPURITY NEUTRALIZATION

[75] Inventors: Jacques P. Chevallier, Maurepas, France; William C. Dautremont-Smith, Westfield; Charles W. Tu, Bridgewater, both of N.J.

[73] Assignee: AT&T Bell Laboratories, Murray Hill, N.J.

[21] Appl. No.: 719,503

[22] Filed: Apr. 3, 1985

[51] Int. Cl.[4] .................. H01L 21/265; H01L 21/263
[52] U.S. Cl. .................................. 148/1.5; 29/576 B; 29/576 T; 148/187; 148/DIG. 84; 148/DIG. 128; 357/91
[58] Field of Search ............... 148/1.5, 187; 29/576 B, 29/576 T; 357/91

[56] References Cited

U.S. PATENT DOCUMENTS

| 4,266,986 | 5/1981 | Benton et al. | 148/1.5 |
| 4,331,486 | 5/1982 | Chenevas-Paule et al. | 148/1.5 |
| 4,364,779 | 12/1982 | Kamgar et al. | 148/1.5 |
| 4,391,651 | 7/1983 | Yoder | 148/1.5 |
| 4,394,180 | 7/1983 | Dearnaley et al. | 148/1.5 |
| 4,460,412 | 7/1984 | Imura et al. | 148/1.5 |
| 4,469,528 | 9/1984 | Berth | 148/1.5 |
| 4,522,657 | 6/1985 | Rohtagi et al. | 148/1.5 |
| 4,539,743 | 9/1985 | Anthony et al. | 29/576 B |

FOREIGN PATENT DOCUMENTS 53-019778  2/1978  Japan .................. 29/576 T

OTHER PUBLICATIONS

Rao et al. in Ion Implantation in Semiconductors, ed. Chernow et al., Plenum, N.Y., 1977, p. 77.
Martin et al., J. Appl. Phys. 53 (1982) 8706.
Favennec et al., Rev. Phys. Appl. 19 (1984) 191.
Blood in GaAs and Related Compounds, 1980, ed. Thim Inst. of Phys. Conf. #56, Bristol, p. 251.
Newman et al., Radiation Effects, 53 (1980) 41.
Ohmura et al., Phys. Stat. Sol. 15a (1973) 93.
Physica Status of Solidi A, vol. 74, pp. 329-341 (1982), by T. S. Shi et al.
IEEE Transactions on Nuclear Science, vol. NS-29, No. 1, pp. 738-744 (Feb. 1982), by W. L. Hansen et al.
Physics Letters, vol. 93A, No. 6, pp. 303-304 (Jan. 24, 1983), by J. W. Corbett et al.
Nuclear Instruments and Methods, vol. 182, pp. 337-349 (1981), by P. S. Peercy.
Applied Physics Letters, vol. 36, No. 8, pp. 670-671, (Apr. 15, 1980), by J. L. Benton et al.
Physical Review B, vol. 26, No. 12, pp. 7105-7108, (Dec. 15, 1982), by S. J. Pearton et al.
Applied Physics Letters, vol. 40, No. 3, pp. 253-255, Feb. 1, 1982, by S. J. Pearton.
Applied Physics Letters, vol. 41, No. 11, pp. 1078-1080, Dec. 1, 1982, by J. Lagowski et al.
Journal of Applied Physics, vol. 53, No. 6, pp. 4509-4511, Jun. 1982, by S. J. Pearton.
Journal of Applied Physics, vol. 52, No. 2, pp. 1050-1055, 1981, by C. H. Seager et al.
Applied Physics Letters, vol. 43, No. 2, pp. 204-206, Jul. 15, 1983, by C. Sah et al.
Physical Review Letters, vol. 51, No. 24, pp. 2224-2225, Dec. 11, 1983, by J. I. Pankove et al.
Applied Physics Letters, vol. 44, No. 6, pp. 606-608, Mar. 15, 1984, by W. L. Hansen et al.
Journal of Vacuum Science and Technology, vol. 20, No. 1, Jan. 1982, "Hydrogen Plasma Etching of Semiconductors and Their Oxides", by R. P. H. Chang et al.
Journal of Applied Physics, vol. 55, pp. 1221-1223, 1984, by S. J. Pearton et al.

Primary Examiner—Upendra Roy
Attorney, Agent, or Firm—Walter G. Nilsen

[57] ABSTRACT

A process is described for fabricating semiconductor devices in which atomic hydrogen is used to neutralize shallow donors in III-V semiconductor compounds so as to make certain areas exhibit high resistance. Also described is reverse neutralization in which heat is used to convert neutralized regions to regions with n-type conductivity.

14 Claims, 2 Drawing Figures

SHALLOW IMPURITY NEUTRALIZATION

TECHNICAL FIELD

The invention involves the fabrication of semiconductor devices comprising III-V semiconductor compound and the semiconductor devices.

BACKGROUND OF THE INVENTION

Great advancements have been made in semiconductor technology in the last few years largely due to the discovery of new materials and the discovery of new methods of making better materials. These advances have led to new device applications for semiconducting materials and such applications often require different fabrication techniques. Typically, these techniques are aimed toward obtaining smaller size, more precise location of various geometrical features in the device, more accurate shapes for various geometrical features in the structure, greater adherence of metallic substances to the semiconductor surfaces, etc.

Particularly important is the development of semiconductor devices (e.g., integrated circuits, optoelectronic semiconductor devices, memories) involving III-V semiconductor compounds. Such semiconductor materials have a number of desirable properties including higher mobilities, advantageous optical characteristics, etc. In fabricating devices with III-V semiconductor compounds, it is highly desirable to produce areas of high resistivity in close proximity to areas of n-type conductivity. This can be used to form various kinds of circuits or integrated devices as well as to isolate one type of circuit or part of a circuit from another part of a circuit. Indeed, rapid and convenient production of such features is highly desirable in a number of applications.

There is considerable current interest in the incorporation of hydrogen in semiconductors (see, for example, T. S. Shi et al, *Physica Status of Solidi A*, Vol. 74, pp. 329-341 (1982); W. L. Hansen et al, IEEE *Transactions on Nuclear Science*, Vol. NS-29, No. 1, pp. 738-744 (February 1982); J. W. Corbett et al, *Physics Letters*, Vol. 93A, No. 6, pp. 303-304 (Jan. 24, 1983); and P. S, Peercy, *Nuclear Instruments and Methods*, Vol. 182, pp. 337-349 (1981)). A number of references have described work in the use of atomic hydrogen in neutralizing various deep level centers due to either line or point defects in various semiconductors (see, for example, J. L. Benton et al, *Applied Physics Letters*, Vol. 36, No. 8, pp. 670-671 (Apr. 15, 1980); S. J. Pearton et al, *Physical Review B*, Vol. 26, No. 12, pp. 7105-7108 (Dec. 15, 1982); S. J. Pearton, *Applied Physics Letters*, Vol. 40, No. 3, pp. 253-255 (Feb. 1, 1982); J. Lagowski et al, *Applied Physics Letters*, Vol. 41, No. 11, pp. 1078-1080 (Dec. 1, 1982); S. J. Pearton, *Journal of Applied Physics*, Vol. 53, No. 6, pp. 4509-4511 (June 1982); and C. H. Seager et al, *Journal of Applied Physics*, Vol. 52, No. 2, pp. 1050-1055 (1981)). In addition, experiments have been described of the neutralization of boron shallow acceptors in silicon by atomic hydrogen (see, for example, C. Sah et al, *Applied Physics Letters*, Vol. 43, No. 2, pp. 204-206 (July 15, 1983), and J. I. Pankove et al, *Physical Review Letters*, Vol. 51, No. 24, pp. 2224-2225 (Dec. 12, 1983)), but these results have been shown to be due to hydroxyl ions and not hydrogen atoms (see W. L. Hansen et al, *Applied Physics Letters*, Vol. 44, No. 6, pp. 606-608 (Mar. 15, 1984)).

In the fabrication of semiconductor devices with III-V semiconductor compounds, it is highly desirable to have a procedure for neutralizing donor species in III-V compounds so as to create regions of high resistivity, particularly a procedure for precise location of such neutralized region. Also highly desirable is a fabrication procedure where a neutralized region is partly reverted to a donor region, again with high precision as to location of the donor region.

SUMMARY OF THE INVENTION

The invention is a process for making a semiconductor device comprising doped III-V semiconductor compound in which at least a portion of the doped areas are converted into areas of relatively high resistance by diffusing atomic hydrogen. Only shallow dopants are of interest (e.g., silicon, sulfur, tin, tellurium, selenium, etc.) because of their extensive use in doping III-V semiconductor material and their large effect on the semiconducting properties of the material. Typically, interest is centered on dopants that produce energy levels within about 25 mev of the conduction band, although 150 mev may also be employed. Also, interest is centered on situations where the hydrogen atoms neutralize the dopants since this produces highly stable resistive areas. Introduction of atomic hydrogen is usually carried out by use of a hydrogen plasma although other procedures (e.g., electrolytic insertion of atomic hydrogen) may also be used. It is believed that the atomic hydrogen bonds to a donor atom, forming a deep level filled by the electron which otherwise would have been donated to the conduction band. This reduces the free carrier density, thus increasing the electrical resistance in the areas treated. For example, with n-type GaAs(Si), hydrogen plasma exposure at 250 degrees C. decreases free carrier conductivity by several orders of magnitude. The effect may be reversed by exposure of the affected area to high temperatures (typically about 420 degrees C.) for short periods of time (about 3 minutes). Often in the practice of the invention, delineation of the area exposed to the hydrogen plasma may be achieved by various means including use of a mask, etc. Also, delineation of the reversing procedure may also be used as, for example, by use of a heat-reflecting mask or use of a radiation beam (e.g., laser beam or electron beam) to produce local heating. A large variety of devices may be made using the above procedure including stripe-geometry lasers and integrated circuits of various kinds.

DETAILED DESCRIPTION

Figure 1:
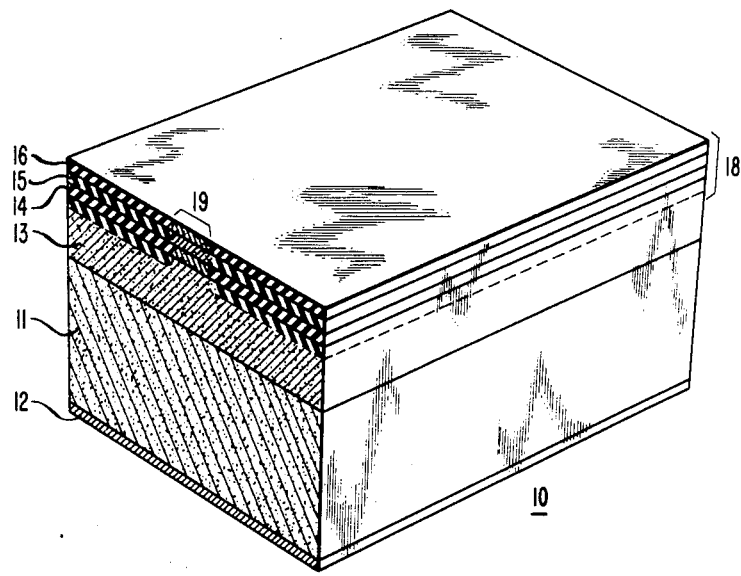
FIG. 1 shows a perspective view of a stripe-geometry, double heterostructure laser usefully made in accordance with the invention.

The invention is based on the observation that atomic hydrogen diffused into n-type semiconducting III-V compounds neutralizes the doping and dramatically increases the resistivity. Generally, such a procedure is best carried out above 200 degrees C. up to an upper limit determined by the semiconductor stability. Also observed is that heating a particular hydrogenated area to high temperatures (generally over about 275 degrees C.) in the absence of atomic hydrogen returns the area to its original n-type semiconducting state.

The invention is applicable to III-V semiconductor compounds with shallow donor doping. Shallow donor dopants are those dopants that create energy levels close to the conduction band. Generally, levels within about 25 mev (millielectron volts or electron volts $\times 10^{-3}$) of the conduction band are preferred for high doping efficiency, with levels within 9 or even 6 mev more preferred.

The invention may be practiced on a substrate material (typically GaAs and InP) or on an epitaxial layer (often a binary, ternary, or quaternary material) grown on a substrate. Typical epitaxial materials on gallium arsenide are as follows: gallium arsenide, gallium aluminum arsenide, gallium indium phosphide lattice matched to gallium arsenide. Typical epitaxial materials on indium phosphide are indium phosphide, indium gallium arsenide (e.g., $In_{0.53}Ga_{0.47}As$), and aluminum indium arsenide (e.g., $Al_{0.47}In_{0.53}As$). Typical dopants for n-type III-V semiconductor compounds are silicon, sulfur, tin, and tellurium.

For InP and phosphorus containing epitaxial layers (e.g., InGaAsP), some provision should be made to avoid surface loss of phosphorus during exposure to atomic hydrogen. This either involves a thin protective layer on the InP, which is permeable to atomic hydrogen but not phosphorus, or the use of a gaseous phosphorus source to prevent depletion of phosphorus from the surface of the InP. Other compounds also need protection; for example, InGaAs, where arsenic is less strongly bound than in GaAs.

In general terms, the procedure for neutralizing shallow donors in III-V compound semiconductors is to introduce atomic hydrogen to the area where the shallow donors are located. Preferred temperature of the III-V semiconductor compound is between 200 and 400 degrees C., With the range from 225 to 300 degrees C. most preferred. Below about 200 degrees C., the donor neutralization takes place inconveniently slowly; above about 400 degrees C., the effect self-anneals so that it is sometimes difficult to obtain the full effect of donor neutralization. The temperature range from 225 to 300 degrees C. yields rapid and maximum neutralization of donor dopants.

As stated above, the procedure is applicable to bulk material and to layered material. Typical applications with bulk material are usually to provide insulating surface layers (say on GaAs substrates). For layered structures, care should be taken as to the depth of penetration for the atomic hydrogen. For lightly doped material, hydrogen neutralization takes place to a considerable depth (for example, 2 $\mu$m for a carrier concentration of about $2 \times 10^{15}$ cm$^{-3}$). With more highly doped layers, penetration is somewhat less (typically 0.6 $\mu$m for carrier concentrations of $2.4 \times 10^{17}$ cm$^{-3}$ and about 0.4 $\mu$m for $2 \times 10^{18}$ cm$^{-3}$). Deeper penetration is possible at higher temperatures or longer exposure times.

Unusually good results are obtained with silicon doped gallium arsenide, with doping depth less than about 1000 Angstroms or even 700 Angstroms. Typically, such samples are made by depositing thin layers of doped gallium arsenide on an insulating substrate such as semi-insulating gallium arsenide. Shallow ion implanted samples may also be used. Such samples, particularly when doped at carrier concentrations over about $10^{17}$ cm$^{-3}$, yield high swings in resistivity and can serve to delineate circuits or isolate various parts of a circuit or integrated array.

A hydrogen plasma procedure is described in a reference by R. P. H. Chang et al entitled, "Hydrogen Plasma Etching of Semiconductors and Their Oxides", *Journal of Vacuum Science and Technology, Vol.* 20, No. 1, (January 1982). However, hydrogen insertion for donor neutralization is best performed at lower plasma power densities where plasma etching of the semiconductor is reduced to a negligible level. Electrochemical introduction of atomic hydrogen is also useful in neutralizing the electrical activity of shallow donors in III-V semiconductor compounds. The electrochemical procedure is also carried out in the temperature range from 200-400 degrees C., with the range around 250 degrees C. (e.g., 225-300 degrees C.) most preferred.

A variety of samples were exposed to atomic hydrogen and their electrical properties measured before and after treatment to demonstrate the effect of atomic hydrogen on the electrical properties of these samples and to demonstrate that the effect is due to atomic hydrogen.

The samples were labeled "A, B, C, . . . ". All the samples were (100) oriented gallium arsenide. The first three samples were molecular beam epitaxy (MBE) grown layers; sample A was a 3 $\mu$m layer with a carrier concentration of $2.2 \times 10^{15}$ cm$^{-3}$; sample B was a 1.2 $\mu$m layer with an initial doping level of $2.4 \times 10^{17}$ cm$^{-3}$; and sample C was a 500 Angstrom layer with a carrier concentration of $2 \times 10^{18}$ cm$^{-3}$. Sample D was a bulk crystal of silicon-doped gallium arsenide grown by horizontal Bridgman technique. The carrier concentration was $1.4 \times 10^{18}$ cm$^{-3}$. Sample E was a silicon implanted sample. The implantation was carried out on semi-insulating, undoped gallium arsenide grown by the liquid encapsulated Czochralski technique. In the implantation process, the samples were exposed to 60 kev $^{29}$Si ions to a dose of $3 \times 10^{12}$ cm$^{-2}$ and annealed in a controlled As-H$_2$ atmosphere at 850 degrees C. for 20 minutes.

Hydrogen plasma exposure was performed in a capacitively coupled, parallel plate reactor (Technics PEII) operating at a low frequency ($\sim$30 kHz). This low frequency produces energetic ion bombardment (e.g., $H_2^+$, $H^+$) of the substrate as well as exposing it to atomic hydrogen. Exposure was performed at 250 degrees C. for 30 minutes, at a H$_2$ pressure of 750 mtorr and a plasma power density of 0.08 Wcm$^{-2}$. The amplitude of the R.F. voltage appearing at the driven electrode was 280 V. A flow of 100 sccm of purified H$_2$ was used. GaAs wafers were cleaned in organic solvents and dipped in dilute HF for native oxide removal immediately prior to being loaded onto the cold substrate table. Heating to 250 degrees C. was performed under flowing N$_2$ at about 500 mtorr. After plasma exposure, the GaAs wafers were allowed to cool under an H$_2$ atmosphere at a few torr pressure. The extent of plasma etching of the GaAs was measured to be less than 100 Angstroms. Helium plasma exposure was carried out under identical conditions, with the exception of the R.F. amplitude being slightly larger at 300 V.

Electrochemical hydrogen insertion was performed at the same temperature from an H$_3$PO$_4$ electrolyte in a simple two-electrode cell consisting of a Si-implanted GaAs cathode and a carbon anode. A constant current density of $\sim 10^{-2}$A cm$^{-2}$ was employed, but with most of the charge carried going into H$_2$ evolution. Such a process has been used to neutralize deep level centers in crystalline silicon (S. J. Pearton et al, *Journal of Applied Physics*, Vol. 55, page 1221–1223 (1984)).

Hall measurements have been carried out on layer B at 300 K. and 77 K. using the Van der Pauw method. The resistivity of layer C was deduced from I–V measurements using the transmission line technique. Capacitance-voltage measurements at 20 kHz were performed at 300 K. to investigate the silicon activation profile in all samples (except layer C) before and after hydrogenation. For C–V profiles, an MSI model 102 mercury probe was used in conjunction with an HP 4275A LCR meter. In nonhydrogenated implanted samples, electrically active profiles closely follow the expected profile with peak doping densities of $\approx 3.5 \times 10^{17}$ cm$^{-3}$ at 0.05 $\mu$m from the surface. After hydrogenation treatment of implanted samples in either the plasma or electrolytic cell, the electrical activity of the silicon dopant was completely neutralized, with the implanted region having the same resistivity as unimplanted wafers. Moreover, C–V profiles of MBE samples A and B as well as of the bulk n+ crystal indicate a strong reduction of the carrier concentration in the part of the layer close to the surface. The depth to which the carrier concentration is modified is inversely dependent on the level of Si doping. In the case of the two higher doped samples, a decrease in carrier concentration in the near-surface region of more than an order of magnitude occurred. The exact magnitude closer to the surface cannot be determined due to the large space charge width at zero applied bias, which is further evidence for a highly resistive surface layer. Helium plasma exposure of the Si-implanted samples causes no change in the carrier concentration profile. These results clearly show that introduction of hydrogen in GaAs(Si) is able to de-activate the silicon donors.

A variety of measurements were carried out to determine the effect of hydrogen neutralization of donor carriers. Among these measurements were Hall measurements and conductivity measurements before and after hydrogen diffusion and at a variety of temperatures. Particularly significant is the carrier density and carrier mobility before and after hydrogen diffusion.

Table I shows some of the results of Hall measurements and conductivity measurements on samples B and C at room temperature and liquid nitrogen temperatures. Thicknesses of the layer of sample B and sample C are 1.2 $\mu$m and 0.05 $\mu$m, respectively. Before hydrogen plasma exposure, the doping level of the layer of sample B was $2.4 \times 10^{17}$ cm$^{-3}$; and sample C was $2 \times 10^{18}$ cm$^{-3}$. The symbol n(300 K.) refers to the carrier density of 300 degrees K.; $\mu$(300 K.) to the carrier mobility at 300 degrees K.; and $\rho$(300 K.) to the conductivity at 300 degrees K.

TABLE I

| | Layer B | | | | Layer C |
|---|---|---|---|---|---|
| | n(300K) (cm$^{-3}$) | $\mu$(300K) (cm$^2$/v.s.) | n(77K) (cm$^{-3}$) | $\mu$(77K) (cm$^2$/v.s.) | $\rho$(300K) ($\Omega$.cm) |
| Before H Plasma | $2.4 \times 10^{17}$ | 3390 | $2.3 \times 10^{17}$ | 3250 | $10^{-3}$ |
| After H Plasma | $1.4 \times 10^{17}$ | 3430 | $1.3 \times 10^{17}$ | 3430 | $10^3$–$10^4$ |

For sample B, the carrier concentration shown is an average over the total thickness of 1.2 $\mu$m. This value is about two times less the initial value. This ratio is consistent with the fact that hydrogen deactivates the silicon atoms within the first 0.5 $\mu$m of this layer. Since the measured mobility is the mobility of the carriers in the region not reached by the hydrogen atoms, $\mu$ is the same before and after hydrogenation as expected. For the heavily doped thin layer (layer C), we observe an increase of the resistivity by at least 6 orders of magnitude which is indicative of a drastic decrease of the free carrier concentration.

The above measurements and results clearly show that diffusion of atomic hydrogen into shallow-donor III–V semiconductor compounds can drastically reduce the semiconductor conductivity of the affected area and produce areas of high resistance in doped III–V semiconductor compounds.

The invention is particularly well illustrated by a description of certain devices usefully made using the inventive process. FIG. 1 shows a stripe-geometry double-heterostructure (DH) laser 10 in which the active region is confined to a small channel by use of hydrogen diffusion. The laser structure 10 is made up of p-GaAs substrate 11 with metal electrode 12 and a series of epitaxial layers p-Al$_x$Ga$_{1-x}$As 13, n-GaAs or p-GaAs 14, n-Al$_x$Ga$_{1-x}$As 15, and n+GaAs 16. Atomic hydrogen is used to make the layers resistive in portions outside the active area but leaving the active region 19 unchanged. A mask is usually used to prevent atomic hydrogen (say from a plasma) from reaching the active region.

The invention procedure may also be used to provide electrical isolation between components on the same semiconductor chip. Such electrical isolation is often provided by a mesa structure, that is actual removal of material to prevent electrical influence from one FET structure from reaching a neighboring FET. Use of atomic hydrogen neutralization provides a much easier procedure with less damaging effect on the semiconductor wafer, while maintaining a planar wafer surface more suitable for subsequent processing (e.g, photoresist application).

Figure 2:
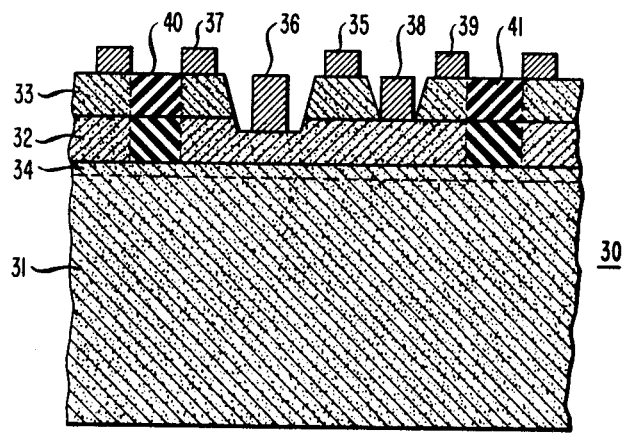
FIG. 2 shows a side view of a field-effect transistor (FET) circuit on a semiconductor chip where circuit isolation is usefully achieved in accordance with the invention.

A typical example is shown in FIG. 2. Here, a side view of a portion of a semiconductor circuit is shown. The circuit 30 is a pair of FETs with a common electrode; one in the enhancement mode and one in the depletion mode. This pair of FET circuits is known as an inverter circuit and is used extensively in a variety of devices including digital devices. The pair of FETs are electrically isolated from other FET pairs on the same chip.

The FET pair circuit 30 is made on a substrate (not shown) of semi-insulating gallium arsenide. A buffer epitaxial layer 31 of undoped gallium arsenide is on top of the substrate. Above the buffer layer is a layer of n+AlGaAs 32 (typical composition Al$_{0.28}$Ga$_{0.72}$As doped with silicon to a concentration of about ($\pm$50 percent) $1.5 \times 10^{18}$ cm$^{-3}$) and then a layer of n+GaAs 33 (typically doped with silicon to a concentration of about ($\pm$50 percent) $2.0 \times 10^{18}$ cm$^{-3}$). Typical thicknesses of the layers are 300–400 Angstroms for the AlGaAs layer 32 and about 500 Angstroms for the GaAs layer 33. This arrangement produces a narrow region 34 of two-dimensional electron gas in the undoped, semi-insulating substrate where doping elements do not limit electron mobility.

The FET structure is made up of two FET circuits (enhancement-mode FET and depletion-mode FET) with a common electrode 35 serving as the drain of the enhancement-mode FET and the source of the depletion-mode FET. Other electrodes of the enhancement-mode FET are the gate electrode 36 and the source electrode 37. Also shown for the depletion-mode FET are the gate electrode 38 and the drain electrode 39. This FET pair is isolated from similar pairs on the semiconductor chip by means of a region 40, 41 in which the donors have been neutralized by use of atomic hydrogen. Typically, a masking technique is used together with a hydrogen plasma to confine the hydrogen impregnation to the region desired so as to form a region of high resistivity between adjacent FET pairs.

Another important aspect of the invention is the use of a recovery procedure that converts the hydrogen-neutralized region back to an n-type conductivity region. This is done by heating, generally in the range above 275 degrees C. for times between 1 second to 1 hour. Often, complete recovery is desired and at temperatures above about 385 degrees C., this is achieved in a few minutes. A temperature of about 420 degrees C. is convenient for very rapid recovery. Although higher temperatures also yield rapid recovery, excessively high temperatures (say above 800 degrees C.) are to be avoided so as not to cause damage to materials or circuit elements.

A variety of procedures may be used to practice this aspect of the invention. A heat or radiation shield may be used to protect high-resistivity areas and ensure recovery of only certain predetermined regions of the III–V semiconductor. Particularly interesting is the use of a laser, typically of such frequency so that penetration is such as to lead to rapid heating into the depth of the hydrogen neutralization. Use of a laser permits writing (using the laser beam) of the active areas on the surface of the semiconductor.

A typical example is provided by the stripe-geometry laser shown in FIG. 1. Here, it is desirable to limit the semiconducting region to a stripe 19 down the middle of the structure. To achieve this, the layers on top of the structure (13, 14, 15, 16) are exposed to atomic hydrogen, and subsequently a laser is used to heat a stripe 19 down to middle of the laser structure to convert the stripe to semiconducting material.

What is claimed is:

1. A process for producing a III–V semiconductor device from at least one III–V semiconductor compound comprising a doped region with one or more shallow donor dopants having energy level within about 150 mev of the conduction band CHARACTERIZED IN THAT the process comprises the step of incorporating atomic hydrogen into a first portion of the doped region thereby increasing the resistivity of the first portion of the doped region.

2. The process of claim 1 in which the shallow donor dopants produce energy levels within about 25 mev of the conduction band.

3. The process of claim 1 in which the incorporation of the atomic hydrogen takes place with the doped region at a temperature above 200 degrees C.

4. The process of claim 1 in which the III–V semiconductor compound is selected from the group consisting of gallium arsenide, gallium aluminum arsenide, and gallium indium phosphide.

5. The process of claim 1 in which the III–V semiconductor compound is selected from the group consisting of indium phosphide, indium gallium arsenide, aluminum indium phosphide, and indium gallium arsenide phosphide.

6. The process of claim 1 in which the origin of the atomic hydrogen incorporated into the doped region is a hydrogen plasma.

7. The process of claim 1 in which the atomic hydrogen is incorporated into the doped region by an electrochemical procedure.

8. The process of claim 1 in which at least a portion of the first portion of the doped region is made semiconducting again by heating to a temperature above 275 degrees C. for at least 1 second.

9. The process of claim 2 in which the shallow donor dopants produce energy levels within about 6 mev of the conduction band.

10. The process of claim 3 in which the doped region is at a temperature between 225 and 300 degrees C.

11. The process of claim 4 in which the shallow donor dopant is at least one element selected from the group consisting of silicon, sulfur, tin, selenium, and tellurium.

12. The process of claim 4 in which the dopant is silicon.

13. The process of claim 8 in which the temperature range is between 385 and 800 degrees C. and the time is between 1 second and 1 hour.

14. The process of claim 8 in which the heating is produced with a laser beam or electron beam.

* * * * *